US009572272B2

(12) United States Patent
Lee

(10) Patent No.: US 9,572,272 B2
(45) Date of Patent: Feb. 14, 2017

(54) FOLDABLE DISPLAY APPARATUS

(71) Applicant: LG DISPLAY CO., LTD., Seoul (KR)

(72) Inventor: Dal Jae Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 72 days.

(21) Appl. No.: 14/584,764

(22) Filed: Dec. 29, 2014

(65) Prior Publication Data

US 2015/0257290 A1    Sep. 10, 2015

(30) Foreign Application Priority Data

Mar. 5, 2014 (KR) .................. 10-2014-0026103

(51) Int. Cl.

| H05K 5/02 | (2006.01) |
|---|---|
| H05K 5/00 | (2006.01) |
| G09F 9/30 | (2006.01) |
| G06F 1/16 | (2006.01) |
| H05K 1/02 | (2006.01) |
| H04M 1/02 | (2006.01) |

(52) U.S. Cl.
CPC .......... *H05K 5/0226* (2013.01); *G06F 1/1641* (2013.01); *G09F 9/301* (2013.01); *H04M 1/0216* (2013.01); *H05K 5/0017* (2013.01); *H05K 5/0021* (2013.01); *H04M 1/0235* (2013.01); *H04M 1/0268* (2013.01); *H05K 1/028* (2013.01); *H05K 2201/10128* (2013.01); *H05K 2201/2009* (2013.01)

(58) Field of Classification Search
CPC .................................................. G06F 1/1616
See application file for complete search history.

(56) References Cited

U.S. PATENT DOCUMENTS

| 6,377,324 B1 * | 4/2002 | Katsura | G02F 1/133305 349/58 |
|---|---|---|---|
| 6,577,496 B1 * | 6/2003 | Gioscia | G06F 1/1616 345/156 |
| 6,996,424 B2 * | 2/2006 | Ijas | G06F 1/1616 455/575.1 |
| 8,248,764 B2 * | 8/2012 | Hassemer | H04M 1/022 361/679.01 |

(Continued)

FOREIGN PATENT DOCUMENTS

| CN | 102681624 A | 9/2012 |
|---|---|---|
| CN | 103608745 A | 2/2014 |

(Continued)

*Primary Examiner* — Lisa Lea Edmonds
(74) *Attorney, Agent, or Firm* — Birch, Stewart, Kolasch & Birch, LLP

(57) ABSTRACT

A foldable display apparatus for minimizing stress applied to a bending area of a display panel. The foldable display apparatus can include a display panel configured to include a display area which includes a first display area, a second display area, and a bending area which is defined between the first and second display areas, a housing configured to include a first housing member, which supports a first area of the display panel corresponding to the first display area, and a second housing member which supports a second area of the display panel corresponding to the second display area, and a hinge part connected between the first and second housing members, and configured to enable the display panel to be folded or unfolded with respect to the bending area.

15 Claims, 7 Drawing Sheets

(56) References Cited

U.S. PATENT DOCUMENTS

| | | | | |
|---|---|---|---|---|
| 8,804,317 B2* | 8/2014 | Watanabe | G02F 1/13336 | 345/1.1 |
| 8,804,324 B2* | 8/2014 | Bohn | G06F 1/1616 | 345/1.1 |
| 8,804,349 B2* | 8/2014 | Lee | G06F 1/1641 | 361/679.01 |
| 8,971,032 B2* | 3/2015 | Griffin | G06F 1/1616 | 345/156 |
| 9,013,864 B2* | 4/2015 | Griffin | H04M 1/0216 | 16/382 |
| 2006/0146488 A1* | 7/2006 | Kimmel | G06F 1/1616 | 361/679.04 |
| 2010/0182738 A1* | 7/2010 | Visser | G06F 1/1613 | 361/679.01 |
| 2010/0201604 A1* | 8/2010 | Kee | G06F 1/1616 | 345/1.3 |
| 2011/0063783 A1* | 3/2011 | Shim | G06F 1/1615 | 361/679.01 |
| 2011/0128216 A1* | 6/2011 | Renwick | G06F 1/1618 | 345/156 |
| 2012/0002360 A1* | 1/2012 | Seo | G06F 1/1616 | 361/679.01 |
| 2012/0044620 A1* | 2/2012 | Song | G06F 1/1616 | 361/679.01 |
| 2012/0120618 A1* | 5/2012 | Bohn | G06F 1/1681 | 361/749 |
| 2012/0200991 A1* | 8/2012 | Ryu | G06F 1/1601 | 361/679.01 |
| 2012/0236476 A1 | 9/2012 | Wu et al. | | |
| 2012/0236484 A1* | 9/2012 | Miyake | G06F 1/1616 | 361/679.01 |
| 2012/0264489 A1 | 10/2012 | Choi et al. | | |
| 2012/0314399 A1* | 12/2012 | Bohn | G06F 1/1616 | 362/97.1 |
| 2012/0314400 A1* | 12/2012 | Bohn | G09F 9/301 | 362/97.1 |
| 2013/0010405 A1* | 1/2013 | Rothkopf | H04M 1/0216 | 361/679.01 |
| 2013/0148278 A1* | 6/2013 | Honda | G06F 1/1616 | 361/679.01 |
| 2013/0314611 A1* | 11/2013 | Okutsu | H04N 5/64 | 348/739 |
| 2014/0029171 A1* | 1/2014 | Lee | H05K 7/16 | 361/679.01 |
| 2014/0029212 A1 | 1/2014 | Hwang et al. | | |
| 2014/0355195 A1* | 12/2014 | Kee | G06F 1/1616 | 361/679.27 |
| 2016/0085271 A1* | 3/2016 | Morrison | G06F 1/1681 | 361/679.27 |

FOREIGN PATENT DOCUMENTS

| | | |
|---|---|---|
| EP | 2 421 231 A1 | 2/2012 |
| JP | 11-15397 A | 1/1999 |
| KR | 2012/0049762 A | 5/2012 |
| KR | 10-2014-0001376 A | 1/2014 |
| KR | 10-2014-0015881 A | 2/2014 |

* cited by examiner

FOLDABLE DISPLAY APPARATUS

CROSS-REFERENCE TO RELATED APPLICATIONS

This application claims the benefit of the Korean Patent Application No. 10-2014-0026103 filed in the Republic of Korea on Mar. 5, 2014, which is hereby incorporated by reference as if fully set forth herein.

BACKGROUND OF THE INVENTION

Field of the Invention

The present invention relates to a foldable display apparatus, and more particularly, to a foldable display apparatus for minimizing stress applied to a bending area of a display panel.

Discussion of the Related Art

A display apparatus using a flat display panel, such as a liquid crystal display (LCD) apparatus, a plasma display apparatus, an organic light emitting display apparatus, an electrophoretic display apparatus, or an electro-wetting display apparatus, is generally applied to notebook computers, portable electronic devices, televisions (TVs), and monitors.

Recently, even in portable electronic devices, the demand for a large screen is increasing, and thus, an apparatus including a display unit displaying a large screen is being developed and commercialized by connecting a flat display panel. In particular, foldable display apparatuses using the merits of a flexible display panel which is bendable or foldable provide portable convenience and include a display unit which displays a large screen, and thus are attracting much attention as next-generation technology of the display field. The foldable display apparatus may be applied to various fields such as TVs and monitors, in addition to portable electronic devices such as mobile communication terminals, electronic notes, e-books, portable multimedia players (PMPs), navigation devices, ultra mobile personal computers (PCs), mobile phones, smartphones, tablet PCs.

Examples of the foldable display apparatuses may include a foldable display apparatus disclosed in Korean Patent Publication No. 10-2014-0015881 (hereinafter referred to as a background art reference).

The foldable display apparatus disclosed in the background art reference unfolds a flexible display panel with respect to a hinge, thereby providing a large screen.

However, in the background art reference, a crack occurs in a bending area of the flexible display panel due to stress which is applied when the flexible display panel is repeatedly folded and unfolded with respect to the hinge, and for this reason, reliability of the flexible display panel of a display unit is reduced. That is, in the background art reference, since one area and the other area of the flexible display panel is fully folded with respect to the bending area so as to contact each other, a crack easily occurs in the bending area of the flexible display panel.

SUMMARY OF THE INVENTION

Accordingly, the present invention is directed to a foldable display apparatus that substantially obviates one or more problems due to limitations and disadvantages of the related art.

An aspect of the present invention is directed to a foldable display apparatus for minimizing stress applied to a bending area of a display panel.

Another aspect of the present invention is directed to provide a foldable display apparatus in which a display panel is easily folded, and flatness of a curvature part of the display panel is maintained when the display panel is unfolded.

In addition to the aforesaid objects of the present invention, other features and advantages of the present invention will be described below, but will be clearly understood by those skilled in the art from descriptions below.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided a foldable display apparatus including: a display panel configured to include a display area which includes a first display area, a second display area, and a bending area which is defined between the first and second display areas; a housing configured to include a first housing member, which supports a first area of the display panel corresponding to the first display area, and a second housing member which supports a second area of the display panel corresponding to the second display area; and a hinge part connected between the first and second housing members, and configured to enable the display panel to be folded or unfolded with respect to the bending area, wherein the hinge part includes a curvature guide member configured to guide the bending area to be bent at a predetermined curvature through a rotation motion.

It is to be understood that both the foregoing general description and the following detailed description of the present invention are explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the embodiments of the present invention, examples of which are illustrated in the accompanying drawings. Wherever possible, the same reference numbers will be used throughout the drawings to refer to the same or like parts.

The terms described in the specification should be understood as follows. As used herein, the singular forms "a", "an" and "the" are intended to include the plural forms as well, unless the context clearly indicates otherwise. The terms "first" and "second" are for differentiating one element from the other element, and these elements should not be limited by these terms. It will be further understood that the terms "comprises", "comprising", "has", "having", "includes" and/or "including", when used herein, specify the presence of stated features, integers, steps, operations, elements, and/or components, but do not preclude the presence or addition of one or more other features, integers, steps, operations, elements, components, and/or groups thereof. The term "on" should be construed as including a situation where one element is formed at a top of another element and moreover a situation where a third element is disposed therebetween.

Figure 1:
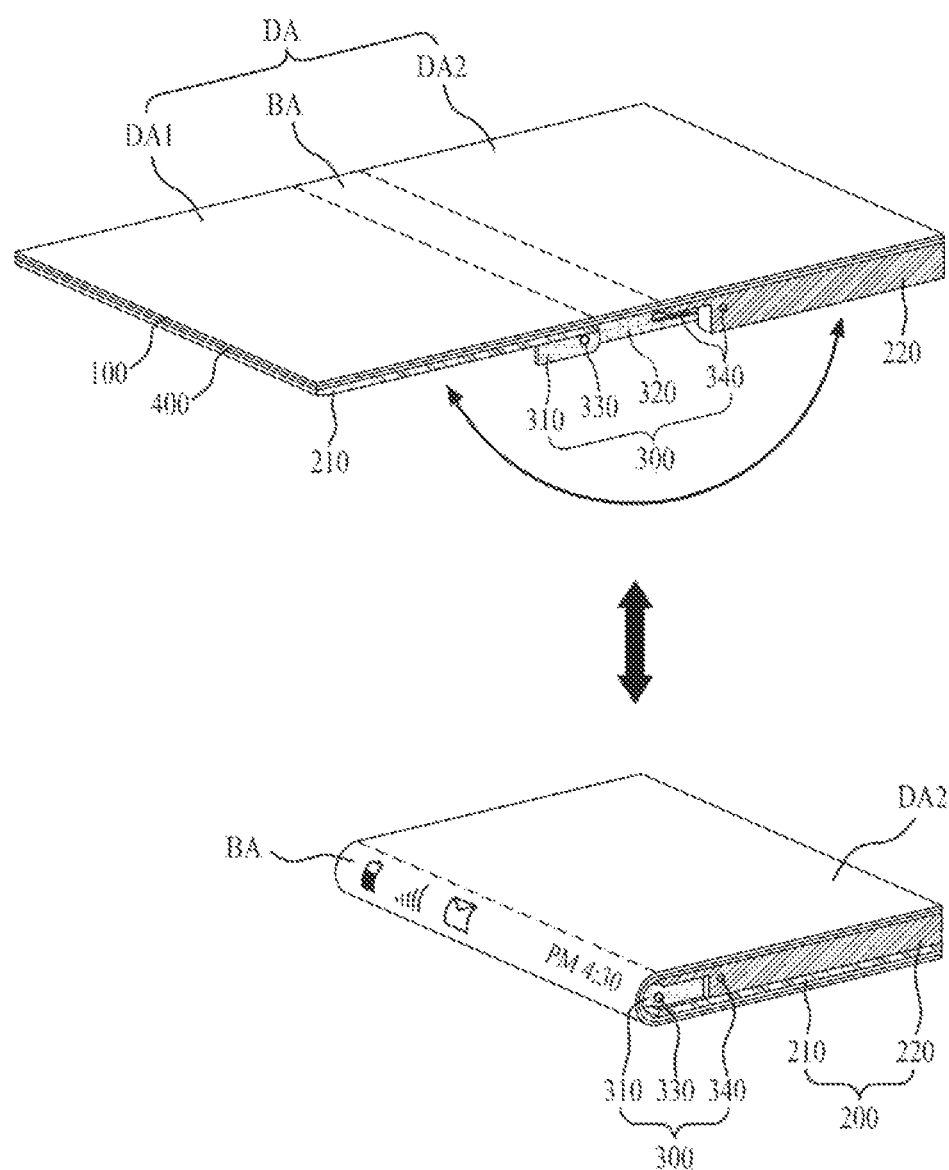
FIG. 1 is a diagram illustrating a folded state and an unfolded state in a foldable display apparatus according to a first embodiment of the present invention.
Figure 2:
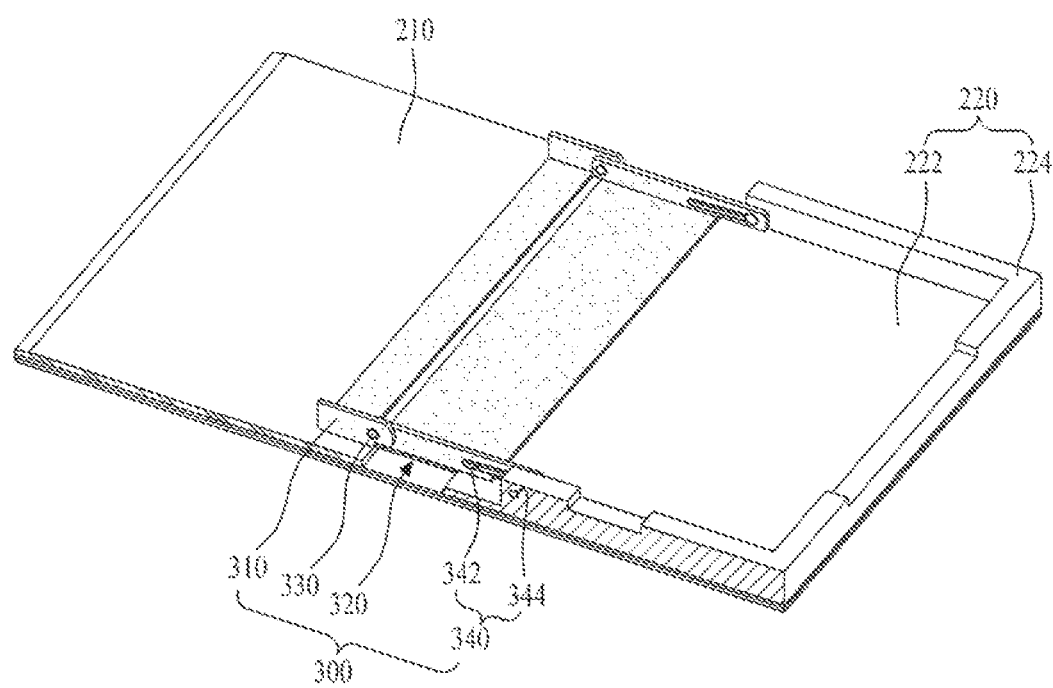
FIG. 2 is a perspective view illustrating a housing and a hinge part illustrated in FIG. 1.
Figure 3:
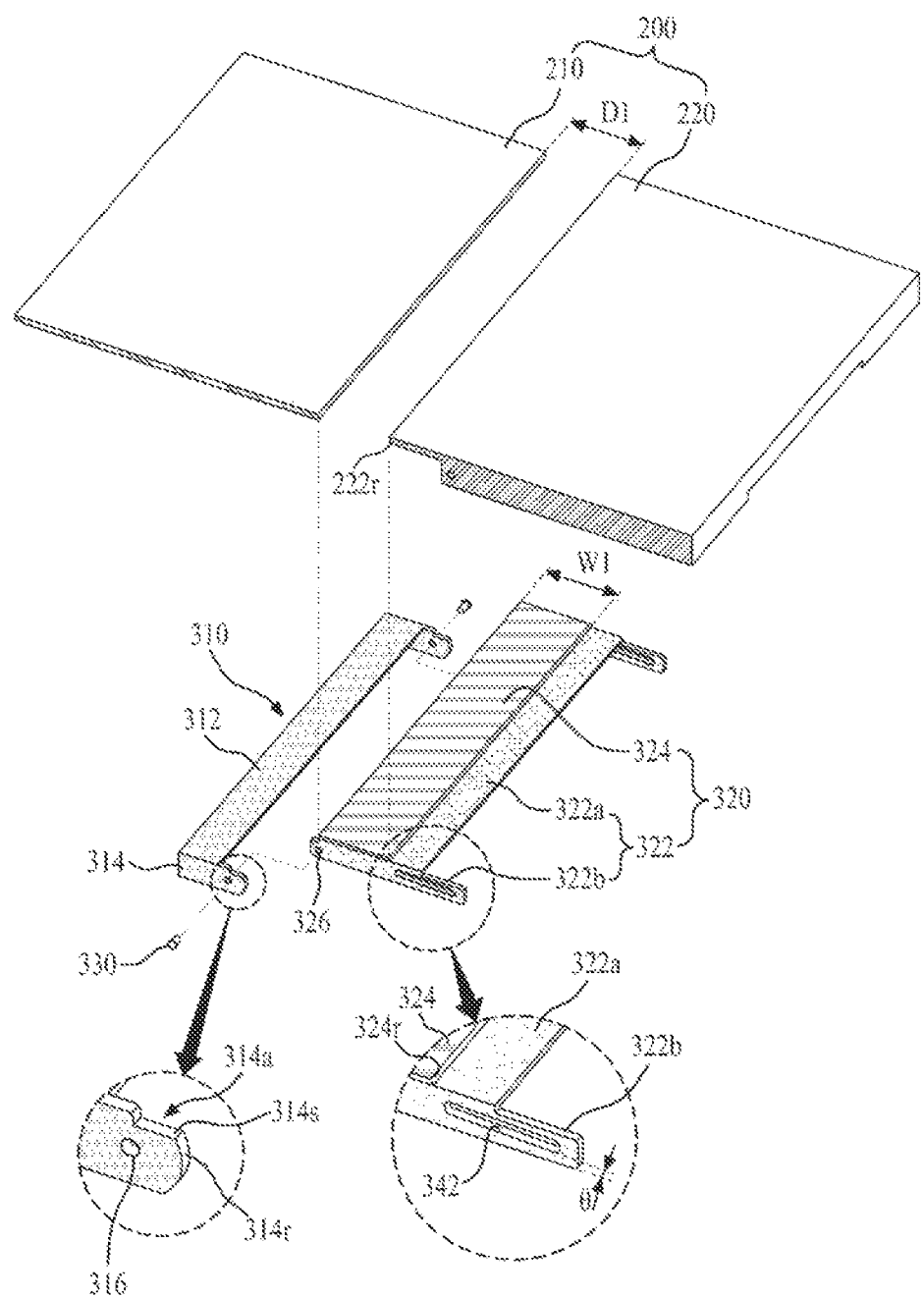
FIG. 3 is an exploded perspective view illustrating a hinge part according to an embodiment of the present invention.

Hereinafter, a foldable display apparatus according to embodiments of the present invention will be described in detail with reference to the accompanying drawings. FIG. 1 is a diagram illustrating a folded state and an unfolded state in a foldable display apparatus according to a first embodiment of the present invention. FIG. 2 is a perspective view illustrating a housing and a hinge part illustrated in FIG. 1. FIG. 3 is an exploded perspective view illustrating a hinge part according to an embodiment of the present invention.

Referring to FIGS. 1 to 3, the foldable display apparatus according to the first embodiment of the present invention includes a display panel 100, a housing 200, and a hinge part 300. The display panel 100 may be a flexible display panel using a flexible substrate. For example, the display panel 100 may be a flexible organic light emitting display panel, a flexible electrophoretic display panel, a flexible liquid crystal display panel, or a flexible electro-wetting display panel.

The display panel 100 may include a flexible substrate, which includes a pixel array including a plurality of pixels for displaying an image, and an encapsulating member that protects the pixel array. The flexible substrate may be formed of a plastic material or metal foil. For example, the flexible pixel array substrate formed of a plastic material may be formed of at least one selected from polyimide (PI), polyethyleneterephthalate (PET), polyethylenapthanate (PEN), polycarbonate (PC), polynorborneen (PNB), and polyethersulfone (PES).

Each of the plurality of pixels includes a display device that displays an image corresponding to an image signal. Here, the display device may be an organic light emitting device, a liquid crystal display device, an electrophoretic device, or an electro-wetting display device. The encapsulating member is formed on a flexible substrate to cover the pixel array, and may be a flexible encapsulating substrate or an encapsulating layer.

In addition, the display panel 100 may further include a polarizing film attached to the encapsulating member, but the polarizing film may be omitted for flexibility of the display panel 100. The foldable display apparatus according to the first embodiment of the present invention may further include a touch screen for a user interface using a user's touch. The touch screen may be attached onto the display panel 100, or may be built into the display panel 100 during a process of forming the pixel array.

The display panel 100 includes a display area DA which includes the plurality of pixels, and the display area DA may be a display screen that displays a certain image according to driving of a panel driving circuit unit accommodated in the housing 200. The display area DA may be divided into a first display area DA1, a second display area DA2, and a bending area BA.

When the display panel 100 is folded, the first and second display areas DA1 and DA2 may simultaneously or selectively display the same image or different images. In this instance, the present invention may provide a double-sided display apparatus in which the same image or different images is/are simultaneously or selectively displayed on a front surface and a rear surface of the foldable display apparatus according to an embodiment of the present invention.

The bending area BA may be set as a partial area of the display area DA (for example, an area between the first and second display areas DA1 and DA2), for providing a bending part of the display panel 100 which has a certain curvature because the display panel 100 is bent when the display panel 100 is folded. The bending area BA may display a sub-image when the display panel 100 is folded. For example, when the foldable display apparatus according to an embodiment of the present invention is a portable information apparatus, the sub-image may be a remaining capacity of a battery, wireless communication sensitivity, time information, or a message reception icon. When the display panel 100 is unfolded, the bending area BA is provided as a flat type of area between the first and second display areas DA1 and DA2, and thus, the bending area BA and the first and second display areas DA1 and DA2 may constitute a single wide screen.

The housing 200 includes first and second housing members 210 and 220 which are formed of a metal or plastic material. The first housing member 210 supports a first area of the display panel 100, and for example, a first area of the display panel 100 can include the first display area DA1. For example, the first housing member 210 may include a first housing plate having a tetragonal shape.

The second housing member 220 supports a second area of the display panel 100, and for example, a second area of the display panel 100 can include the second display area DA2. For example, the second housing member 220 may be provided in a box shape in which a bottom and one edge side are opened. For example, the second housing member 220 includes a second housing plate 222 having a tetragonal shape and a housing side wall 224 which protrudes, to a certain height, from a bottom edge of the second housing plate 222 other than one edge adjacent to the first housing member 210.

A corner or an entirety of one side 222r of the second housing plate 222, which is adjacent to the bending area BA and faces one side of the first housing member 210, may be rounded at a certain curvature. The first and second housing members 210 and 220 are disposed between first and second areas of the display panel 100 and face each other with respect to the bending area BA when the display panel 100 is folded, and thus, an accommodating space is provided between the first and second housing members 210 and 220 which overlap each other. For example, the accommodating space may be a space which is surrounded by the housing side wall 224, and a plurality of driving units (for example, a communication circuit, a power circuit, a battery, a control circuit, a memory, an operational circuit, etc.) necessary for driving the foldable display apparatus may be accommodated in the accommodating space.

The hinge part 300 is connected between the first and second housings 210 and 220 to overlap the bending area BA of the display panel 100, and enables the first housing member 210 and/or the second housing member 220 to rotate, thereby allowing the display panel 100 to be folded or unfolded. That is, when the display panel 100 is folded in order for the first and second housing members 210 and 220 to overlap each other, the hinge part 300 guides the bending area BA of the display panel 100 so as to be bent at a certain curvature, or induces bending of the bending area BA. Also, the hinge part 300 supports and planarizes the bending area BA of the display panel 100 which is unfolded to a flat (or plane) state, thereby preventing the bending area BA from being bent or pressed by an external force.

The hinge part 300 according to an embodiment may include a curvature guide member 310, a planarizing member 320, a rotation shaft member 330, and a sliding guide member 340. The curvature guide member 310 is disposed at one edge rear surface of the first housing member 210 adjacent to the bending area BA of the display panel 100, and when the display panel 100 is folded, the curvature guide member 310 guides the bending area BA so as to be bent at a predetermined curvature. Thus, the curvature guide member 310 includes a first plate 312, a pair of curvature guide side walls 314, and a first through hole 316.

The first plate 312 is coupled to the one edge rear surface of the first housing member 210 adjacent to the bending area BA. The first plate 312 is provided in a rectangular shape having a long side and a short side.

Each of the pair of curvature guide side walls 314 vertically protrudes from both edges of a short side of the first plate 312 to have a certain height, or is bent. In this instance, each of the pair of curvature guide side walls 314 includes an extension part 314a which extends from one side to the second housing member 220 to have a certain length. The extension part 314a includes a stepped part 314s, which is provided in a stepped shape from a top of the curvature guide wall 314, and a rounding part 314r which is provided between a top of the stepped part and a bottom of the curvature guide side wall 314 to have a certain curvature.

A space is provided between a top of the curvature guide side wall 314 and the stepped part 314s. When the display panel 100 is folded, the space allows a corner of the extension part 314a, which is rotated, not to contact the bending area BA, and allows the rounding part 314r of the extension part 314a to contact the bending area BA. That is, when the stepped part 314s is not provided in the extension part 314a, a portion of the bending area BA can be damaged by the corner of the extension part 314a when the initial rotation of the extension part 314a is performed for bending of the bending area BA. Therefore, the stepped part 314s separates the rounding part 314r of the extension part 314a from a top of the curvature guide side wall 314 to a certain height, thereby preventing the bending area BA from being damaged. Accordingly, the rounding part 314r of the extension part 314a contacts the bending area BA which is bent at an arbitrary curvature according to the initial rotation of the extension part 314a, and the bending area BA is bent at a curvature corresponding to a curvature of the rounding part 314r.

The first through hole 316 passes through a front end (i.e., the extension part 314a) of each of the pair of curvature guide side walls 314. The below-described rotation shaft member 330 is inserted into the first through hole 316.

The planarizing member 320 is slid between a supporting position, overlapping the bending area BA, and an avoiding position, which does not overlap the bending area BA, according to a rotation motion of the curvature guide member 310, and supports the bending area BA of the display panel 100 or enables the bending area BA to be bent. Thus, the planarizing member 320 may include a sliding link member 322 and a planarizing plate 324.

The sliding link member 322 may include a sliding body 322a and a pair of side wall links 322b. The sliding body 322a is provided to have a rectangular shape having a long side and a short side, and is disposed at one edge rear surface of the second housing member 220 adjacent to the bending area BA. The sliding body 322a may be formed of a metal or plastic material.

The pair of side wall links 322b vertically protrude from both edges of a short side of the sliding body 322a in parallel with the pair of curvature guide side walls 314 to have a certain height, and are bent. In this instance, a length of a short side of each of the pair of side wall links 322b is relatively longer than that of a short side of the sliding body 322a, and may be longer provided in a direction opposite to a direction from the other side of the sliding body 322a to the first housing member 210.

A second through hole 326 is provided at one end of each of the pair of side wall links 322b adjacent to the first housing member 210. The below-described rotation shaft member 330 is inserted into the second through hole 326.

The planarizing plate 324 is provided in a rectangular shape having a long side and a short side, and is coupled to a top of the sliding body 322a adjacent to the bending area BA. In this instance, a width W1 of a short side of the planarizing plate 324 may be set to less than a distance D1 between the first and second housing members 210 and 220 so that the planarizing plate 324 is inserted between the first and second housing members 210 and 220 and supports the bending area BA.

Figure 4:
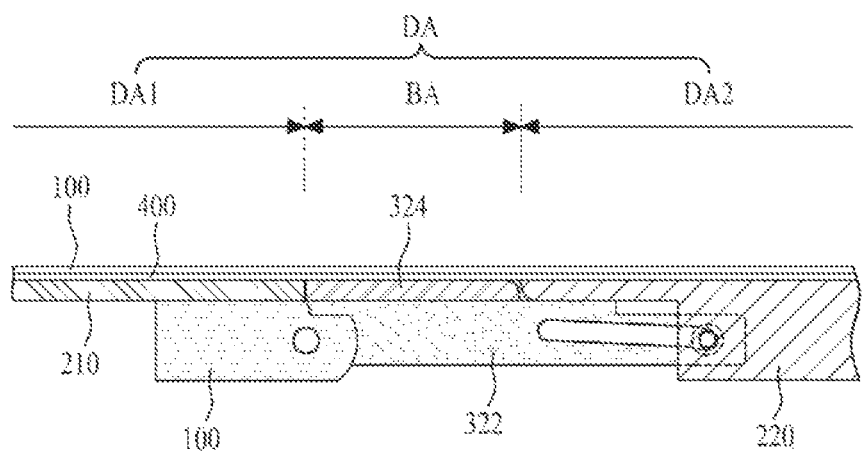
FIG. 4 is a diagram illustrating an unfolded display panel according to an embodiment of the present invention.
Figure 5:
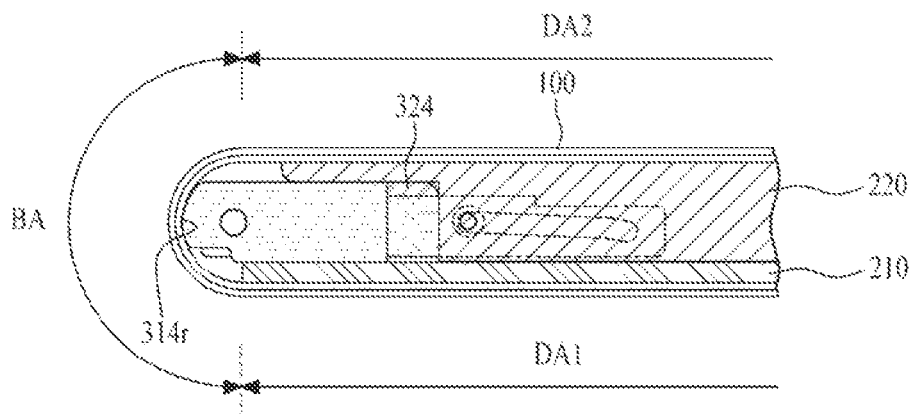
FIG. 5 is a diagram illustrating a folded display panel according to an embodiment of the present invention.
Figure 6A:
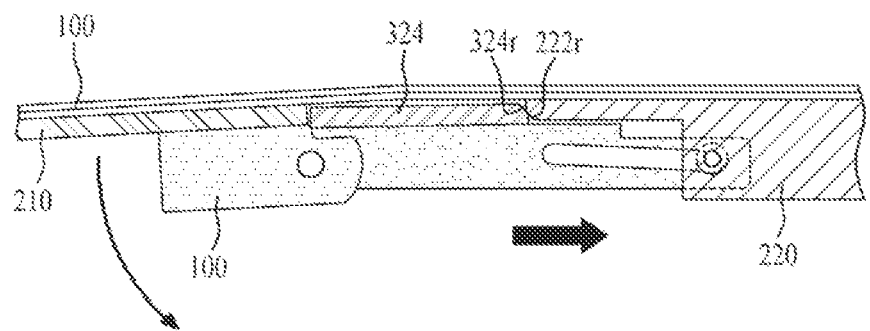
FIGS. 6A and 6B are diagrams illustrating a sliding motion of a planarizing plate according to an embodiment of the present invention.
Figure 6B:
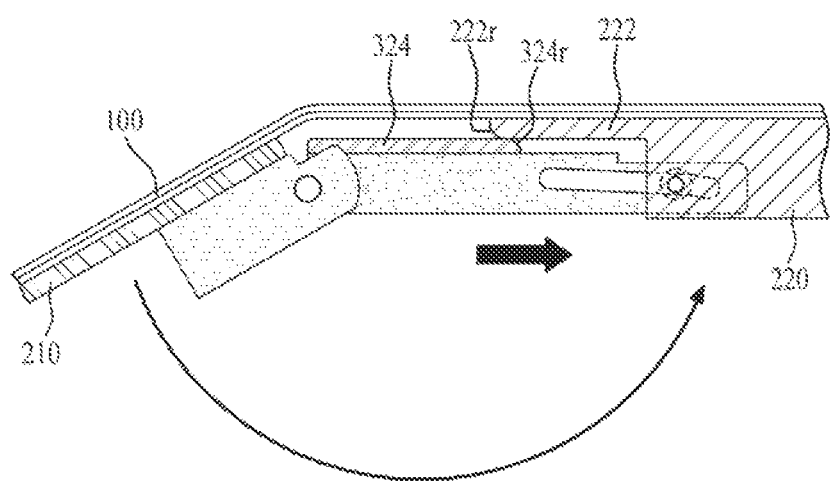

The planarizing plate 324 is slid along with a sliding motion of the sliding link member 322 which interoperates with the rotation of the curvature guide member 310, and performs a supporting operation of supporting the bending area BA or an avoiding operation that does not obstruct bending of the bending area BA. That is, as illustrated in FIG. 4, when the display area DA of the display panel 100 is unfolded to a plane state, the planarizing plate 324 is inserted between the first and second housings 210 and 220 to overlap the bending area BA, and supports the bending area BA. Further, as illustrated in FIG. 5, when the bending area BA of the display panel 100 is bent at a certain curvature according to the bending guide of the rounding part 314r which is provided at the curvature guide side wall 314, the planarizing plate 324 is slid to an avoiding position which does not overlap the bending area BA, and enables the bending area BA to be bent.

In a folding operation of the display panel 100, the planarizing plate 324 which is inserted between the first and second housing members 210 and 220 as illustrated in FIG. 4 is moved onto one side of the second housing member 220, and then is slid. Therefore, in order for the planarizing plate 324 to be more smoothly slid, a corner or an entirety of the other side 324r of the planarizing plate 324 facing one side of the second housing plate 222 may be rounded at a certain curvature.

The planarizing plate 324 is does not have to be provided as a separate element which is disposed at the sliding link member 322, and may be provided as one body with the sliding body 322a of the sliding link member 322. In this instance, the sliding body 322a includes a protrusion supporting part which protrudes to a certain height, and when the display panel 100 is unfolded, the protrusion supporting part is inserted between the first and second housing members 210 and 220, and supports the bending area BA. Here, a corner or an entirety of the other side of the protrusion supporting part facing one side of the second housing plate 222 may be rounded at a certain curvature.

The rotation shaft member 330 rotatably connects the curvature guide member 310 to the planarizing member 320. That is, the rotation shaft member 330 is inserted into the first through hole 316 of the curvature guide member 310 and the second through hole 326 of the planarizing member 320, and rotatably connects one side of the curvature guide member 310 to one side of the planarizing member 320. The rotation shaft member 330 may be a shaft or a rivet.

The rotation shaft member 330 may include a boss which protrudes from an outer side of the side wall link 322b to have a certain shape and length and is inserted into the first through hole 316 instead of the second through hole 326. Further, the rotation shaft member 330 may include a boss which protrudes from an inner side of the curvature guide side wall 314 to have a certain shape and length and is inserted into the second through hole 326 instead of the first through hole 316.

The sliding guide member 340 guides sliding of the planarizing member 320 according to rotation of the curvature guide member 310. Thus, the sliding guide member 340 includes a guide rail 342 and the sliding pin 344.

The guide rail 342 is provided in a hole shape to pass through the other end of each of the pair of side wall links 322b of the planarizing member 320, and guides a sliding path of the side wall link 322b. In this instance, the guide rail 342 may be provided to be inclined at a certain angle "θ" along a length direction with respect to a bottom of the side wall link 322b so that the planarizing plate 324 is slid to the supporting position according to sliding of the pair of side wall links 322b, and is smoothly inserted between the first and second housing members 210 and 220 or is smoothly slid from the supporting position to the avoiding position.

The sliding pin 344 is fixedly disposed at the housing side wall 224 of the second housing member 220, inserted into the guide rail 342, and slid along a sliding path based on the guide rail 342. The sliding pin 344 may include a head part, which has a greater diameter than that of the guide rail 342, and a coupling part which is vertically coupled to the head part and is fixedly disposed at the housing side wall 224 to pass through the guide rail 342. Therefore, each of the pair of side wall links 322b is slid according to sliding of the sliding pin 344 inserted into the guide rail 342.

Referring again to FIG. 1, the foldable display apparatus according to the first embodiment of the present invention may further include a base film 400 that is disposed at a top of the housing 200 and supports the display panel 100. The base film 400 is coupled to the top of the housing 200 (i.e., a top of each of the first and second housing members 210 and 220) to cover the hinge part 300, and supports the display panel 100. The base film 400 may be formed of a flexible plastic material, or may be formed of a flexible metal material for dissipating the heat of the display panel 100.

In addition, the display panel 100 is disposed on the base film 400. In this instance, when the display panel 100 is attached to and fixed to a whole top of the base film 400, a length of the display panel 100 may be changed in a process where the display panel 100 is folded or unfolded by the hinge part 300, and partial detachment occurs in the bending area BA of the unfolded display panel 100. Therefore, in order to prevent or minimize partial detachment occurring in the bending area BA due to a length change of the display panel 100, only one edge and/or the other edge of the display panel 100 may be attached to and coupled to a top of the base film 400. Likewise, only one edge and/or the other edge of the base film 400 may be attached to and coupled to the top of the housing 200.

The foldable display apparatus according to the first embodiment of the present invention may further include an outer case which surrounds an outer surface of each of the first and second housing members 210 and 220 and surrounds a front edge of the display panel 100. The outer case may include first and second lower outer cases that surround outer surfaces of the first and second housing members 210 and 220 except the hinge part 300, first and second front outer cases that surround a front edge of the display panel 100 except the bending area BA, and a hinge case that surrounds a lower portion and both sides of the hinge part 300 and is formed of a flexible material which is bent when the display panel 100 is folded or unfolded.

According to a structure of the foldable display apparatus according to the first embodiment of the present invention, the bending area BA of the display panel 100 is not fully folded to contact one side with the other side, and is bent at a certain curvature by the curvature guide member 310 of the hinge part 300, thereby minimizing a stress applied to the bending area BA of the display panel 100. Accordingly, a crack occurring in the bending area BA is prevented or minimized, and thus, the reliability of the display panel 100 can be enhanced. Furthermore, according to a structure of the foldable display apparatus according to the first embodiment of the present invention, since the bending area BA of the unfolded display panel 100 is supported by the planarizing member 320 of the hinge part 300, the bending area BA can be prevented from being bent or pressed by an external force, and thus, constant flatness of the unfolded display panel 100 is maintained, thereby displaying a uniform image in the display area DA of the display panel 100.

Figure 7:
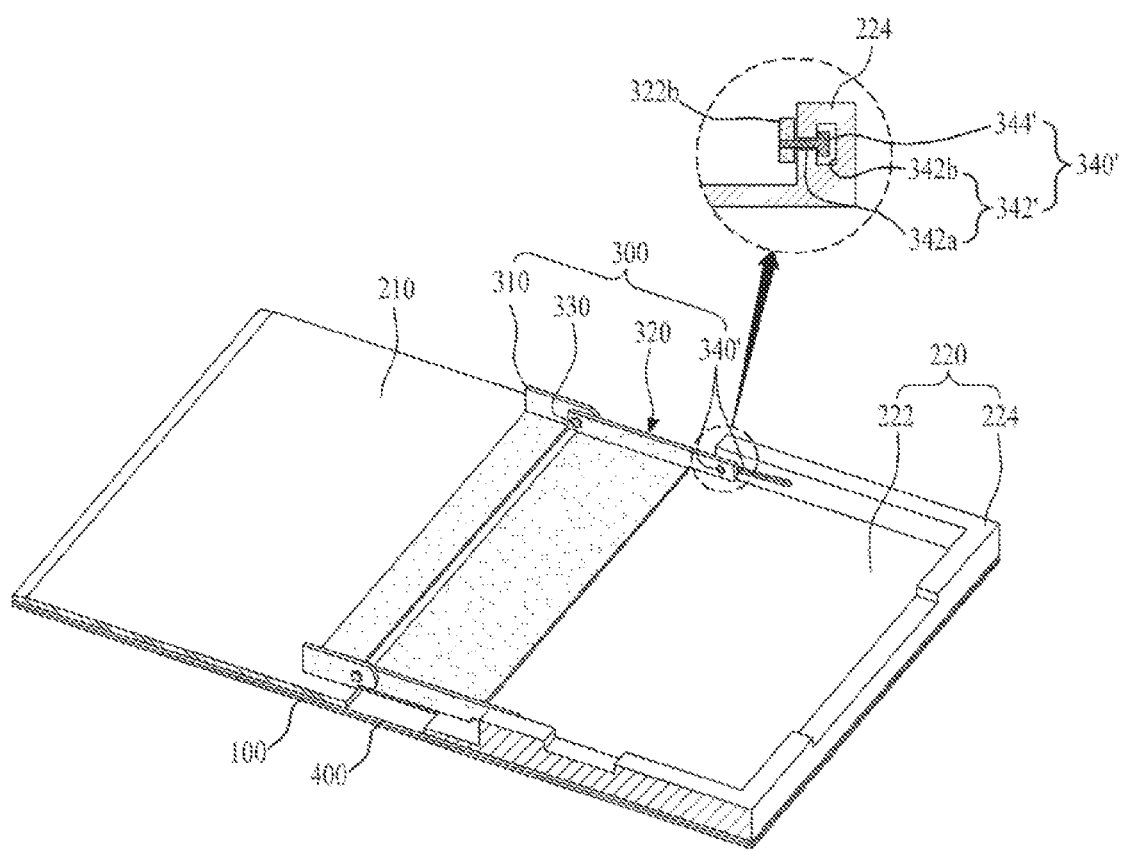
FIG. 7 is a perspective view illustrating a foldable display apparatus according to a second embodiment of the present invention.

FIG. 7 is a perspective view illustrating a foldable display apparatus according to a second embodiment of the present invention, and is implemented by changing a configuration of the hinge part according to the first embodiment of the present invention. In describing the second embodiment of the present invention, elements which are the same as or correspond to the first embodiment of the present invention are not described. In the following description, only a hinge part will be described.

A hinge part 300 according to another embodiment may include a curvature guide member 310, a planarizing member 320, a rotation shaft member 330, and a sliding guide member 340'. In the hinge part 300 having such a configuration, the curvature guide member 310, the planarizing member 320, the rotation shaft member 330 except the sliding guide member 340' are the same as the preceding embodiment, and thus, their detailed descriptions are not repeated.

The sliding guide member 340' of the hinge part 300 according to another embodiment includes a guide rail 342', which is provided at the housing side wall 224 of the second housing member 220, and a sliding pin 344' which is provided at the pair of side wall links 322b of the sliding link member 322 configuring the planarizing member 320, and is inserted into the guide rail 342'.

The guide rail 342' is provided in a multi-step groove shape at an inner surface of the housing side wall 224 facing the side wall link 322b, and guides a sliding path of a corresponding side wall link 322b. For example, the guide rail 342' is provided at the inner surface of the housing side wall 224 to have a ⊥-shaped cross-sectional surface and a certain length. That is, the guide rail 342' includes a first guide groove 342a, which is provided to have a rectangular cross-sectional surface from the inner surface of the housing side wall 224, and a second guide groove 342b which is provided inside from the inner surface of the housing side wall 224 to communicate with the first guide groove 342a. One end of each of the first and second guide grooves 342a and 342b communicates with the outside in order for the sliding pin 344' to be inserted thereinto.

The sliding pin 344' is fixedly disposed at an inner surface of each of the pair of side wall links 322b, slidably inserted into the guide rail 342', and slid along a sliding path based on the guide rail 342'. The sliding pin 344' may include a pin part, which is fixedly coupled to an outer surface of the side wall link 322b and is inserted into the first guide groove 342a of the guide rail 342', and a head part which is provided as one body at an end of the pin part and is inserted into the second guide groove 342b of the guide rail 342'. Therefore, each of the pair of side wall links 322b is slid by sliding of the sliding pin 344' inserted into the guide rail 342'. The foldable display apparatus according to the second embodiment of the present invention has the same effects as those of the preceding embodiment.

Figure 8:
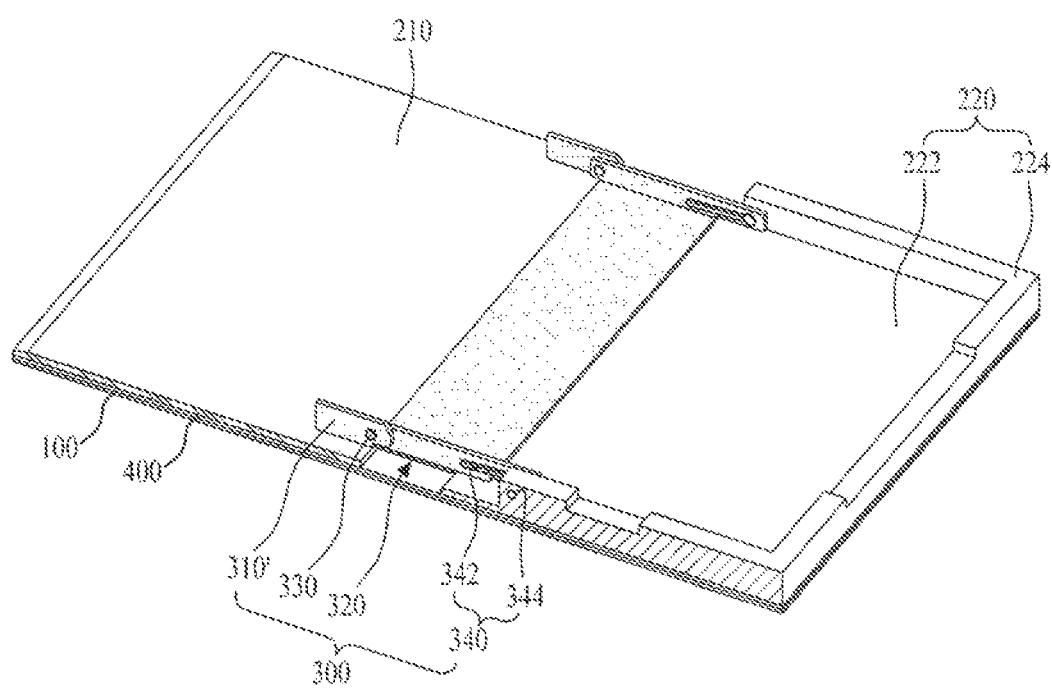
FIG. 8 is a perspective view illustrating a foldable display apparatus according to a third embodiment of the present invention.

FIG. 8 is a perspective view illustrating a foldable display apparatus according to a third embodiment of the present invention, and is implemented by changing a configuration of the hinge part according to the first embodiment of the present invention. In describing the third embodiment of the present invention, elements which are the same as or correspond to the first embodiment of the present invention are not described. In the following description, only a hinge part will be described.

A hinge part 300 according to another embodiment may include a pair of curvature guide side walls 310', a planarizing member 320, a rotation shaft member 330, and a sliding guide member 340. In the hinge part 300 having such a configuration, the planarizing member 320, the rotation shaft member 330, and the sliding guide member 340 are the same as the first embodiment of the present invention, and thus, their detailed descriptions are not repeated.

The pair of curvature guide side walls 310' are provided in parallel at one edge rear surface of the first housing member 210 adjacent to the bending area BA of the display panel 100 to have a certain height, and when the display panel 100 is folded, the pair of curvature guide side walls 310' guide the display panel 100 in order for the bending area BA to be bent at a predetermined curvature. That is, the pair of curvature guide side walls 310' have the same shape as that of the pair of curvature guide side walls 310 according to the first embodiment of the present invention except that the pair of curvature guide side walls 310' are provided as one body with the first housing member 210, and thus, their detailed descriptions are not repeated.

Therefore, a configuration of the hinge part 300 is simplified, and the foldable display apparatus according to the third embodiment of the present invention has the same effects as those of the foldable display apparatus according to the first embodiment of the present invention. In the foldable display apparatus according to the third embodiment of the present invention, the sliding guide member 340 of the hinge part 300 may be changed to have a configuration of the sliding guide member 340' illustrated in FIG. 7.

As described above, according to the embodiments of the present invention, the bending area of the display panel is not fully folded to contact one side with the other side, and is bent at a certain curvature by the curvature guide member of the hinge part, thereby minimizing stress applied to the bending area of the display panel. Accordingly, a crack which occurs in the bending area is prevented or minimized, and thus, the reliability of the display panel can be enhanced.

Moreover, according to the embodiments of the present invention, since the bending area of the unfolded display panel is supported by the planarizing member of the hinge part, the bending area can be prevented from being bent or pressed by an external force, and thus, constant flatness of the unfolded display panel is maintained, thereby displaying a uniform image in the display area of the display panel.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A foldable display apparatus comprising:
a display panel configured to include a display area which includes a first display area, a second display area, and a bending area which is defined between the first and second display areas;
a housing configured to include a first housing member, which supports a first area of the display panel corresponding to the first display area, and a second housing member which supports a second area of the display panel corresponding to the second display area; and
a hinge part connected between the first and second housing members, and configured to enable the display panel to be folded or unfolded with respect to the bending area,
wherein the hinge part comprises a curvature guide member configured to guide the bending area to be bent at a predetermined curvature through a rotation motion,
wherein the curvature guide member comprises a pair of curvature guide side walls provided at the first housing member, and configured to perform the rotation motion according to a rotation of the first housing member, and each of the pair of curvature guide side walls comprises a rounding part provided to have a certain curvature, and configured to guide the bending area to be bent at the predetermined curvature, and
wherein the hinge part further comprises a planarizing member configured to perform a sliding motion between a supporting position, which overlaps the bending area, and an avoiding position, which does not overlap the bending area, according to a rotation motion of the curvature guide member.

2. The foldable display apparatus of claim 1, wherein the planarizing member supports the bending area at the supporting position to planarize the bending area.

3. The foldable display apparatus of claim 2, wherein the planarizing member comprises a planarizing plate with a rectangular shape having a long side and a short side, and is coupled to a top of the planarizing member adjacent to the bending area.

4. The foldable display apparatus of claim 3, wherein the planarizing plate is configured to slide along with a sliding motion of the planarizing member which interoperates with a rotation of the curvature guide member, and performs a supporting operation of supporting the bending area while the display panel is unfolded or an avoiding operation that does not obstruct bending of the bending area while the display panel is folded.

5. The foldable display apparatus of claim 3, wherein the planarizing plate protrudes to a certain height from the planarizing member, and when the display panel is unfolded, the planarizing plate is inserted between the first and second housing members.

6. The foldable display apparatus of claim 1, wherein the hinge part further comprises:
 a rotation shaft member configured to rotatably connect each of the pair of curvature guide side walls to one side of the planarizing member; and
 a sliding guide member configured to guide a sliding motion of the planarizing member.

7. The foldable display apparatus of claim 6, wherein the planarizing member comprises:
 a sliding body configured to support the bending area at the supporting position; and
 a pair of side wall links provided at the sliding body, respectively connected to the pair of curvature guide side walls through the rotation shaft member, and configured to perform a sliding motion according to a rotation motion of each of the pair of curvature guide side walls.

8. The foldable display apparatus of claim 7, wherein the planarizing member further comprises a planarizing plate coupled to the sliding body, inserted between the first and second housing members, and configured to support the bending area at the supporting position.

9. The foldable display apparatus of claim 8, wherein,
 the second housing member comprises a housing plate configured to support the second area of the display panel, and
 a side of the planarizing plate and a side of the housing plate, which face each other, are rounded at a certain curvature.

10. The foldable display apparatus of claim 7, wherein the sliding guide member comprises:
 a guide rail provided at one of the side wall links and the second housing member, and configured to guide a sliding path of the planarizing member; and
 a sliding pin provided at the other side wall link of the side wall links and the second housing member, and coupled to the guide rail for sliding the guide rail.

11. The foldable display apparatus of claim 10, wherein the guide rail is inclined in a length direction with a certain slope.

12. The foldable display apparatus of claim 1, wherein each of the pair of curvature guide side walls comprises an extension part including a stepped part, and the stepped part is provided in a stepped shape from a top of each of the pair of curvature guide side walls and the rounded part, respectively.

13. The foldable display apparatus of claim 12, wherein the stepped part is configured to provide a space between the top of each of the pair of curvature guide side walls and the stepped part that allows a corner of the extension part to not contact the bending area while the display panel is folded.

14. The foldable display apparatus of claim 1, wherein the pair of curvature guide side walls is provided as one body with the first housing member.

15. A foldable display apparatus comprising:
 a display panel configured to include a display area which includes a first display area, a second display area, and a bending area which is defined between the first and second display areas;
 a housing configured to include a first housing member, which supports a first area of the display panel corresponding to the first display area, and a second housing member which supports a second area of the display panel corresponding to the second display area; and
 a hinge part connected between the first and second housing members, and configured to enable the display panel to be folded or unfolded with respect to the bending area,
 wherein the hinge part comprises a curvature guide member configured to guide the bending area to be bent at a predetermined curvature through a rotation motion, and
 wherein the hinge part further comprises a planarizing member configured to perform a sliding motion between a supporting position, which overlaps the bending area, and an avoiding position, which does not overlap the bending area, according to a rotation motion of the curvature guide member.

* * * * *